United States Patent [19]

Bennett et al.

[11] Patent Number: 4,500,988
[45] Date of Patent: Feb. 19, 1985

[54] VLSI WIRED-OR DRIVER/RECEIVER CIRCUIT

[75] Inventors: Donald B. Bennett, Burnsville; Lee T. Thorsrud, Saint Paul; Thomas W. Petschauer, Bloomington, all of Minn.

[73] Assignee: Sperry Corporation, New York, N.Y.

[21] Appl. No.: 355,803

[22] Filed: Mar. 8, 1982

[51] Int. Cl.³ ............................................. H03K 17/00
[52] U.S. Cl. ........................................ 370/85; 375/36
[58] Field of Search .......................... 375/36; 370/85; 307/270

[56] References Cited

U.S. PATENT DOCUMENTS

| | | | |
|---|---|---|---|
| 4,024,501 | 5/1977 | Herring et al. | 375/36 |
| 4,101,734 | 7/1978 | Dao | 375/36 |
| 4,216,389 | 8/1980 | Carter | 375/36 |
| 4,337,465 | 6/1982 | Spracklen et al. | 375/36 |
| 4,388,725 | 6/1983 | Saito et al. | 375/36 |

Primary Examiner—Douglas W. Olms
Assistant Examiner—Kenneth I. Rokoff
Attorney, Agent, or Firm—William C. Fuess; Kenneth T. Grace; Marshall M. Truex

[57] ABSTRACT

Bidirectional communication upon a high performance synchronous (25 MHz line transfer rate) parallel digital communication bus interconnecting large numbers (up to 256 along 1 meter of bus) of very large scale integrated (VLSI) cirucit devices is supported by VLSI wired-Or driver/receiver (D/R) circuit elements synergistically operative under a two-time-phase bus electrical protocol for bus drive. During a first phase of approximately 10 nanoseconds all interfacing driver circuits additively drive, or pull-up, connected bus lines to a +3 v.d.c. logical High condition. During a second phase of approximately 20 nanoseconds during each 40 nanosecond cycle time D/R circuits present high impedance to charged bus lines for maintenance of such logical High and transmission of a logical "0", or else one or more D/R circuits drain line charge toward 0 v.d.c. for transmission for a logical "1". Two point driver to receiver, wired-OR, broadcast, and/or eavesdrop communication are supported for bus lines.

15 Claims, 7 Drawing Figures

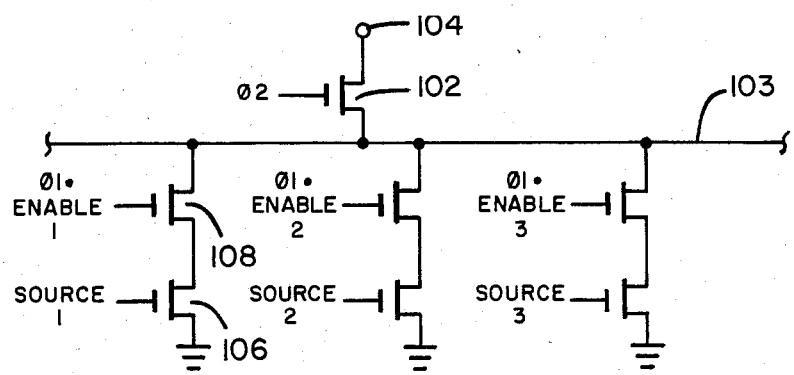
PRIOR ART
*Fig. 1*
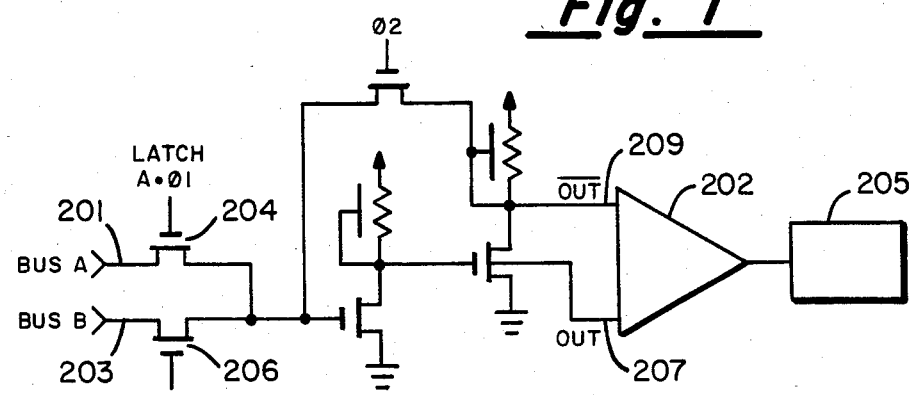
PRIOR ART
*Fig. 2*
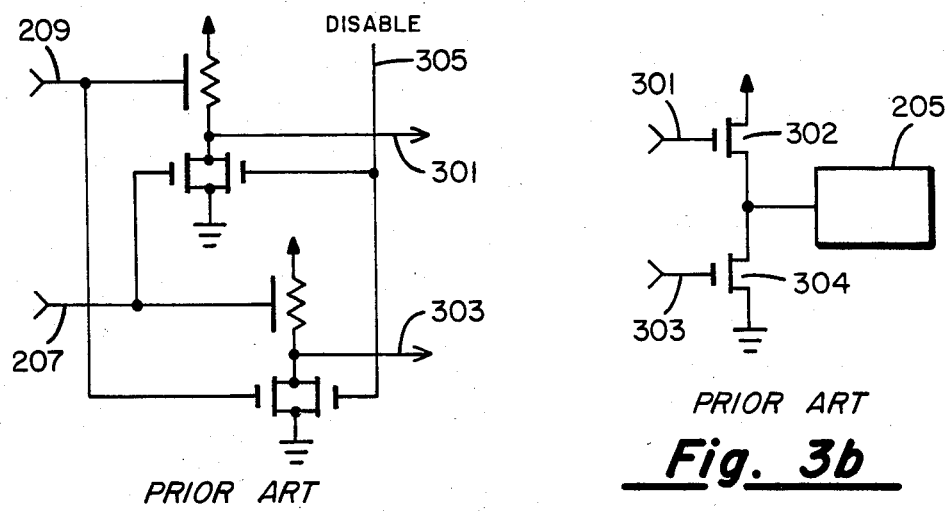
PRIOR ART
*Fig. 3a*
PRIOR ART
*Fig. 3b*

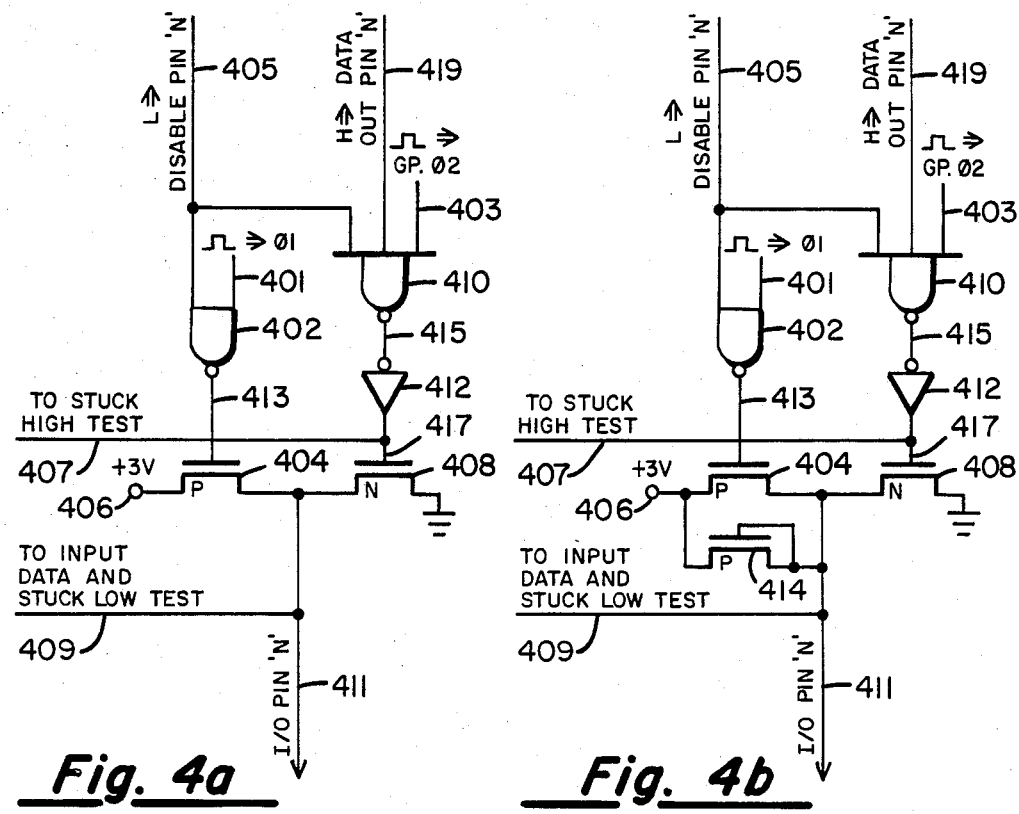
*Fig. 4a*      *Fig. 4b*
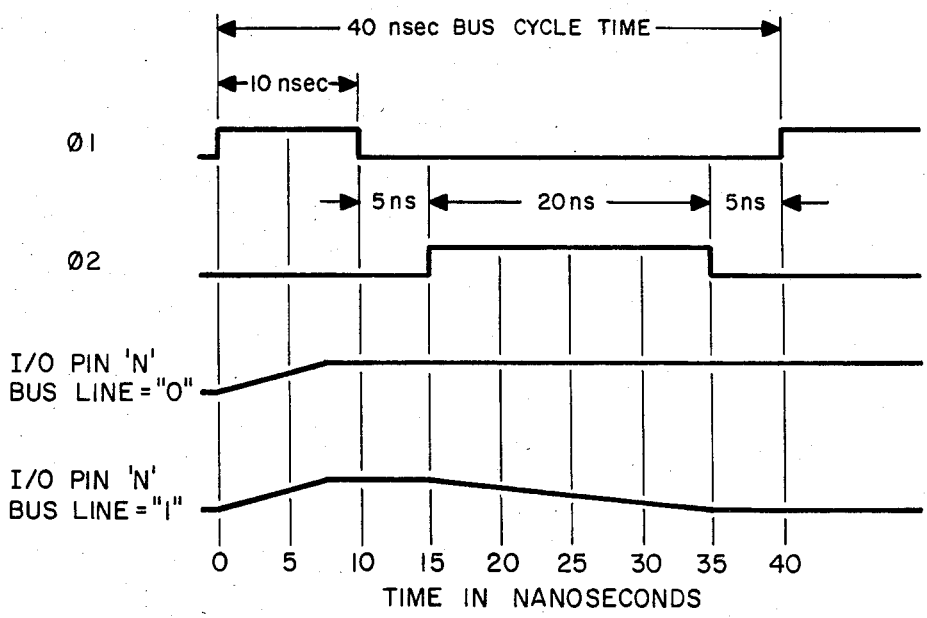
*Fig. 5*

VLSI WIRED-OR DRIVER/RECEIVER CIRCUIT

REFERENCE TO RELATED APPLICATIONS

The instant application claims subject matter disclosed in another patent application filed on the same day as the instant application, the other application being further identified as:

U.S. Ser. No. 356,051 entitled "Versatile Interconnection Bus" filed in the name of D. B. Bennett, et al.

Both applications are assigned to common assignee Sperry Corporation, a corporation of the State of Delaware having a place of business at 1290 Avenue of the Americas, New York, N.Y., 10019.

BACKGROUND OF THE INVENTION

The current invention will, through a special two-time phase electrical communication protocol plus the synergistic utilization of all interconnected drivers in combination to charge the interconnecting bus lines, take a communication method previously found only on Very Large Scale Integrated Circuit (VLSIC) chip internal buses and expand such method and modify such method to allow high performance interchip communication—an area currently dominated by tri-state drivers. The discussion in the book "Introduction to VLSI Systems" © 1980 by Mead and Conway and published by Addison-Wesley is especialy pertinent to an understanding of prior art VLSIC interconnect. The Mead and Conway data, developed from the CalTech Silicon Structures Project, is related in substantially their own description in the following six paragraphs and associated FIGS. 1 through 3.

Mead and Conway's internal chip design incorporates two buses. For the dual reasons of the internal function of their interconnected blocks, such as an Arithmetic Logic Unit (ALU), and the unacceptable size of a tri-state driver, as will be shortly discussed, a two-phase electrical communication protocol is employed. The interconnected ALU of Mead and Conway performs its operation during the phase 2 ($\phi2$) period and does not have valid data to place into its output register until the end of $\phi2$. If data is to be transferred from the output register of the ALU to its input register, this must be done during the phase 1 ($\phi1$) period. They adopt a standard timing scheme in which all transfers on the buses occur during $\phi1$. Thus they can make use of the $\phi2$ period when the ALU is performing its operation to precharge the buses and thereby solve what they describe as one of the knotty problems associated with a technology designed for ratio logic. If they had insisted that the tri-state drivers associated with various sources of data for a bus be able to drive up as well as down, they would have required both a sourcing and sinking transistor, together with a method for disabling both transistors. While it is perfectly possible to build such a driver, it is a space consuming matter to use such a driver at every point where it is wished to source data onto an internal bus. By using the bus precharge scheme the tri-state drivers of Mead and Conway become simply two series transistors as shown in FIG. 1.

FIG. 1 shows a precharged internal bus communication circuit. In FIG. 1, single transistor 102 charges bus line 103 during time phase 2 ($\phi2$) from voltage source 104. During time phase 1 ($\phi1$) the data from one source called Source 1, for example the ALU output register, is placed on the gate of one transistor of the pairs of series transistors, for example on transistor 106. An enable signal which may come high during $\phi1$, called $\phi1$. Enable One, is placed on the other one of the same series transistors; that is on transistor 108. If one and only one of the enable signals is allowed to come high during any one $\phi1$ period, the bus can be driven from as many sources as necessary. The performance of such a bus is limited only by the pull-down capability of the two series transistors. For the purposes of the present invention it is important to note that only one transistor 102 precharges the internal bus line 103. FIG. 1 essentially shows a bus charging/discharging driver circuit. It is obvious that data would be gated off the bus by "receiver" gates at any location or locations only during $\phi1$ while the bus is carrying information such as being driven in a wired-OR fashion.

Mead and Conway find communication with what they call the "outside world," such communication as is accomplished by the present invention, to be more difficult. Mead and Conway note that although in particular applications the interface from a port of the data path to the outside world may be a point to point communication, the ports will often connect to a bus. Thus it is desirable to use port drivers which may be set in a high impedance state. Drivers which can either drive the output high, drive the output low, or appear as a high impedance to the output are known as tri-state drivers. Such drivers allow as many potential senders on the bus as necessary.

FIG. 2 shows the circuit for the interface of a tri-state driver 202 to a contact pin or pad 205 which connects to an interchip communication bus. In FIG. 2 either chip internal BUS A on input 201 or chip internal or BUS B on input 203 can be respectively latched into the input of a tri-state driver 202 during $\phi1$ by signal LATCH A·$\phi$ on the gate of first gating transistor 204 or by signal LATCH B·$\phi$ on the gate of second gating transistor 206. The receiver circuit as connects to connect pad 205 is not shown in FIG. 2 for being realizable with any number of essentially trivial implementations. Mead and Conway point out that pad 205 could be latched into the incoming register of any interchip communication bus connected device at any time independent of or asynchronous to, the clock phases of the tri-state driver chip. As the present invention, however, adapts the two phase bus communication protocol as shown for internal bus line 103 in FIG. 1 to the external interchip communication bus line, as is connected to pad 205 in FIG. 2, the receiving, or latching, of data from the bus will be done only at a specified time, as was required in the internal bus communication scheme of FIG. 1. A sample trivial receiver circuit, an AND gate, which is, however, gated at a specific time, is shown in the DRIVER/RECEIVER circuit of FIG. 82 within U.S. patent application Ser. No. 356,051 which is incorporated by reference within this application. Such a gated AND gate, or the receiver part of the present invention of a VLSI Wired-OR DRiver/Receiver Circuit, is a known prior art method of receiving a signal from a bus, either asynchronously or synchronously with the driving of such bus. The concept and utility of the present invention must be compared to the prior art design of the tri-state driver 202 which drives the pad 205 directly. Details of the tri-state driver 202 are shown in FIG. 3.

The signals OUT and OUT as respectively occur on lines 207 and 209 of FIG. 2 are fed to a series of super buffer stages as illustrated in FIG. 3a, each of which provides true and complement signals as respective outputs 301 and 303 and each of which is disabled by a DISABLE signal on line 305. The DISABLE signal does not cause all current to cease flowing in the drivers, since the pullup transistors are depletion type, but reduces the current to a value where it can be handled by the disable transistor of the following buffer stage. In general there are a number of super buffer stages of this sort in a tri-state driver. The very last stage of the driver is shown in FIG. 3b. It is not a super buffer but employs enhancement mode transistors 302 and 304 for both pullup and pulldown. These transistors are very large in order to drive the large external capacitance associated with the wiring attached to the pad 205. They are disabled in the same manner as the super buffers, except that when the gates of both transistors are low, the output pad is truly tri-stated, meaning that naught but high impedance is presented to pad 205. The two output transistors 302 and 304 are a factor of approximately e (equals approximately 2.71828) larger than the transistors of last super buffer in the buffer string.

The series of super buffer stages necessary to transform the impedance from that of the internal circuits on-chip to that sufficient for driving a pad attached to wiring in the outside world is quite large, and imposes a delay of some factor times a logarithm of this impedance ratio upon communications between the chip and the outside world. Any help that can be obtained in making this transformation is of great value. For example, the latch and buffers associated with the input bus circuit to the pad drivers can themselves be graded in impedance level, so that by the time the OUT and $\overline{OUT}$ signals on lines 207 and 209 respectively are derived, they are at a considerably higher current drive capability than the buses. The buses are of considerably larger capacitance than the interconnection nodes on the chip, and thus the initial latch buffers can be larger than typical inverters on the chip. All such tricks help to minimize the number of stages between the buses and the output pad which drives the outside interchip communication bus, and thus the total delay in translating internal chip signals such as OUT and $\overline{OUT}$ into drive of the interchip communication bus line connected to pad 205.

A more complete explanation of these prior art techniques may be found in the indicated reference of Mead and Conway. The high drive current required for the interchip communication bus and resultant size problem for these VLSIC pad driver stage output transistors is very severe. If 37 pads were to be driven on each VLSIC chip and a one meter bus interconnecting 256 chips supported, the equivalent current transistors of the pad driver stage shown in FIG. 3b might be as large as 4×800 square microns for the N-type transistor 304 and 4×2400 square microns for the P-type. For a reasonable size VLSIC substrate this means that one-third of the available area is devoted to interconnecting lands, one-third to logics, and one-third to the two drive per bus line interface transistors. The present invention will later be seen to be much more economical in the interface transistor size required.

SUMMARY OF THE INVENTION

The present invention generally relates to the apparatus and method by which bused digital communication may be effectuated between numbers of interconnected devices, and specifically to an apparatus and method by which numbers of very large scale integrated circuits (VLSIC) may communicate upon a digital bus in a wired-OR manner. Wired-OR communication means that all interconnected devices read the logically OR'ed function on each bus line of the binary data sent by all transmitting one(s) of such devices.

It is a first object of the present invention that a digital communication bus should be created that is greatly physically extensible in length and in the number of intercommunicating devices affixed thereto. In the present invention all interfacing driver circuits will be synergistically cooperatively additive to charge interconnecting bus lines during a first phase, although a second phase selective discharge of such bus lines as allows the transmission of information thereupon will still transpire only at the site or sites of certain transmitting devices. The great physical extensibility arises because, in a certain technology such as Complementary Metal Oxide Semiconductor, it is of greater benefit, for a given current drive and size of bus interconnected drivers, that such drivers should be synergistically interoperative to drive the bus lines to one state (charge to non-zero voltage) than to drive the bus lines to the opposite state (discharge to zero voltage).

It is a second object of the present invention, such object as is really a parallel statement of the first object, that for a digital communication bus of fixed length and performance that the required current drive capacities, and resultant size as implemented on VLSIC substrates, of the interfacing drivers should be minimized. This driver transistor size minimization consonant with equal performance in time and across the space of the interconnection bus) is accomplished in the present invention through synergistic additive cooperation for bus line drive between all interconnected bus line drivers.

It is a third object of the present invention that high performance communication upon a digital bus of reasonable length connecting useful numbers of VLSIC devices should transpire in a wired-OR manner. In the preferred embodiment of the invention 25 MHz communication between up to 20 VLSIC devices along up to 1 meter of bus exhibiting normal impedance characteristics as are typical of printed circuit interconnection will be supported in a wired-OR manner. Such a wired-OR manner requires that each interconnected driver should be capable of driving the bus to either a logically high or logically low condition (as represent the binary states of information transmitted) and should also be capable of being tri-stated, or presenting naught but high impedance to the connected bused line. The apparatus of the present invention is so capable.

It is a fourth object of the present invention that if any driver upon a digital communication bus is not powered then it will present naught save high impedance to such bus connection and will not interfere with bused communication between other, powered, devices.

It is a fifth object of the present invention that, as a secondary improvement to the scheme and apparatus employed, that interconnected bus lines should optionally be beneficiently leaked current, or pulled up, or controlled in their rate of discharge to ground when not being driven. This is for the purpose that time lengthy observations of the state of such bus lines for testing and not communication, should be facilitated.

BRIEF DESCRIPTION OF THE DRAWINGS

FIG. 1 shows a prior art circuit for precharging and communicating upon a bus line.

FIG. 2 shows a prior art data port interface terminating in a tri-state driver connecting to a contact pad.

FIG. 3a shows a prior art tri-state buffer stage, being one of many possible such preliminary stages within the tri-state driver of FIG. 2.

FIG. 3b shows a prior art pad driver circuit which is the final stage within the tri-state driver of FIG. 2.

FIG. 4a shows the driver/receiver circuit of the present invention, such as is replicated on each I/O bus line interconnected device.

FIG. 4b shows a variant of the driver/receiver circuit of the present invention wherein an element serving as a very small resistance is utilized on the output of the driver/receiver circuit to pull-up the connected I/O bus line.

FIG. 5 shows the timing and electrical protocol of the present invention such as enables the operation of plural bus interconnected driver/receiver circuits for wired-OR bused communication.

DESCRIPTION OF THE PREFERRED EMBODIMENT

In accordance with the principles of the present invention each bus line is connected both to a positive driving, bus line charging, and to a negative driving, bus line discharging, transistor at each of all interconnected devices. The invention operates under a two time phase protocol. During a first phase the positive driving transistors at each interconnectd device are operative in combination, or synergistically, to charge respectively connected bus lines to a non-zero voltage. During a second phase such charging is disabled and each individual connected device will either do naught but present high impedance to a charged bus line, which but slowly decays within the time of such second phase due to intrinsic capacitance, or else any one or ones of such devices can discharge such charged bus line toward zero volts. All connected devices sense the state of bus lines during such second phase and can discriminate if any one or ones of the interconnected devices has substantially discharged a bus line or else that such bus line remains substantially charged. When thedischarged, zero volt, condition is defined as a logical "0" then wired-OR communication is effectuated on such bus lines between interconnected devices. (If the discharged, zero volt, condition were defined as a logical "1" then wired-NOR communication would transpire on such bus lines.)

The preferred embodiment of the the invention allows bus communication at a 25 MHz data rate. To be more specific, a data bit presented to the interchip communication system will be usable on the next chip 40 nanoseconds later. A pin transmitting data at this rate is called 100% pin-efficient. Note that issues of current drive, gate delays, noise, error correct, etc., are intertwined herein. The time to communicate is thus a function of the physical structures—Complementary Metal Oxide Semiconductor (CMOS), Very Large Scale Integrated Circuits (VLSIC), printed circuit substrate, printed wiring, etc.—in which the preferred embodiment of the invention is implemented. The present disclosure of the invention teaches an efficient communication scheme adaptable to electrical structures implemented in other technologies.

The preferred embodiment of the invention operations to effectuate bused communication between two to twenty devices upon a digital communication bus of maximum length of one meter. Data sent by any one device is readable by as many as all twenty of the devices. Therefore the distributed reactance of the attached devices is considered part of the reactance of the bus which is treated as a transmission line. So considered, the total one meter bus will exhibit approximately 256 picofarads capacitance which is evenly distributed along its length. Signals will propagate the one meter length in approximately 5.72 nanoseconds, or about 1.8 nanoseconds per foot for a transmission line of these characteristics. Upon explanation of the present invention, it will be seen that first driving transistors will be synergistically operative to charge the bus while a second driving transistor within any one or ones device or devices may later operate to discharge the bus. The first driving transistors will be sized for a worst case operation wherein two only devices are connected by one meter of bus exhibiting 256 picofarads total capacity. In such a case each first driving transistor within each of the two devices needs charge one-half the bus capacitance, or 128 picofarads, to three volts. Each first driving transistor within the present invention will be capable of doing this within eight nanoseconds. Similarly, one only second driving transistor within any of the interconnected devices may be called upon to substantially discharge the entire 256 picofarads of bus capacitance to zero volts. These second driving transistors are sized to be capable of doing this within twenty nanoseconds. As the present invention is explained it will become obvious that alterations in the bus characteristics of length and/or minimum and maximum numbers of interconnected devices, or alterations in bus timing, can be met with appropriately sized interface driver transistors.

All communication supported by the present invention is wired-OR amongst all interfacing logics. To support this wired-OR logic as implemented in high speed VLSIC technology, an electrical communications protocol utilizing time-phased active pull-up logics integrated into VLSI circuit devices, in conjunction with the unavoidable capacitance of the wire interconnection, was adopted. This scheme of time-phased active pull-up logics allows wired-OR logical communication to transpire with several advantages. The scheme avoids the economic, space, weight, power, and reliability costs associated with external pull-up packages. The active distributed pull-up logics avoid the speed limiting RC time constants of passive pull-up resistors. The numerous interconnected active pull-up logics can be individually constructed of less powerful transistor-types because they will be additive or reinforcing when operated jointly on each interconnected line of the bus. The manner in which this active pull-up, time-phased, high speed VLSI wired-OR logical communication transpires is as follows.

A clock of two approximately equal phases, both within each cycle time of 40 nanoseconds, is applied to every interfacing chip on the bus. During a first phase all interfacing chip logics drive all bus lines to a +3 v.d.c. logical High condition. During a second phase all drive is disconnected from the bus save for bus-owning interfaces which may wish to drive certain lines to a +0 v.d.c logical Low condition, a state which represents transmission of a logical "1" on the bus lines. For any lines upon which such bus owning interfaces desire to transmit a logical "1" the line is simply left alone. That is, the potential bus driver as well as all other interfacing elements simply present a high impedance to the line. Interfacing logics not owning the bus also do no driving, but simply present high impedance during this second phase. The net result is that if the bus owner of a line does not drive it toward 0 v.d.c., the intrinsic unavoidable capacitance of the bus line will keep it in essentially the +3 v.d.c., logical "0", state throughput the second phase and until the next first phase line charging. All interfacing logics gate the bus line during this second phase. If the line has been driven toward 0 v.d.c. by a bus-owning interface then a logical "1" will be sensed. But if the line has not been so driven, and remains at essentially the +3 v.d.c. for at least the short duration of the second phase (a duration of approximately one-half of the 40 nanosecond clock), then all interfacing logics sense a logical "0".

The wired-OR logics mean that data may be simultaneously sent by more than one interconnected driver/receiver into the same line. In other words, more than one bus-owning interface is possible. In this case, the chips reading the line must read the logical OR of all drivers. The chips may be made aware of when multiple drivers are possible; they may choose to logically control the line in a different manner at those times such as in the conduct of distributed arbitration as is explained in U.S. patent application Ser. No. 356,051. The two phase electrical protocol and nature of the line drive is not changed, however, for communication either two point driver to receiver, wire-OR(multiple drivers), broadcast (multiple identified and directed receivers), and/or eavesdrop (multiple undirected and covert receivers). In other words, the electrically wired-OR nature of the bus supports a universal communication function—any one or ones of all interconnected devices may drive while any one or ones of all interconnected devices (including the driving devices) may receive.

Collisions are encompassible without catastrophic failure. Under certain abnormal conditions, different chips may attempt to drive a single line in different directions. In these cases, no reliable information will be transferred on the line. The drivers will not suffer permanent damage, nor will other lines not in such conflict be caused to operate incorrectly. If a driver or drivers are unpowered, they will present only high impedance to the connected bus lines and will not interfere with the utilization of such bus lines by powered and enabled devices.

The circuit which permits the use of wired-OR logic for busedcommunication is shown in FIG. 4a. This circuit is intended to be part of a standard cell bus driver receiver, such as the driver/receiver shown in U.S. patent application Ser. No. 356,051, which is incorporated herein by reference. This circuit is replicated on every interconnection line at every device on the bus. The circuit shown in FIG. 4b is a minor variant of the standard circuit as shown in FIG. 4a. This manner in which active pulled-up, time-phased, high speed VLSI wired-OR logical communication transpires is as follows.

Momentarily reference the timing and electrical protocol as shown in FIG. 5. Within each 40 nanosecond bus cycle time there are two clock pulses, clock phase 1 and clock phase 2, both distributed by a master clock to every device on the bus. The nominal timing relationship between clock phase 1 ($\phi$1) and clock phase 2 ($\phi$2) is as shown in FIG. 5, although other variations are possible. Specifically, it is possible to make the phases symmetrical and have both equal 15 nanoseconds in duration. The criteria by which the phase timing is set has to do with the electrical recovery of the bus, such as will become obvious upon further explanation of the function of this circuit. The manner in which each bus line will be driven for data communication is also shown in FIG. 5. Each bus line will always be driven to a logical High or plus three volts during clock phase 1. If the bus owning device(s) desire(s) to communicate a logical "0", it will allow the bus line to remain (charged) at this plus three volt level. If the bus-owning device(s) desire(s) to communicate a logical "1", it will drive the bus line to a logical Low or zero volts during clock phase 2. Therefore the electrical protocol of bus data communication is seen to be the converse of that convention normally utilized for device internal logical signal levels. That is, transmission of a logical "0" on the bus is accomplished by maintaining the bus in a logical High or plus three volts d.c. condition, whereas transmission of a logical "1" is accomplished by driving the bus to a logical Low, or zero volts d.c. condition.

Returning to FIG. 4, the two clock phases such as permit time-phased operation of the present circuit are shown as entering on lines 401 and 403. For the purposes of the present explanation, it may be assumed that disable pin "N" line 405 is a constant High. This line is shown only for parallelism with the eventual utilization of this driver element within the standard cell driver/receiver circuit of the aforementioned patent application. Similarly, To Stuck High Test Line 407 (same as line 417) and To Input Data And Stuck Low Test line 409 (same as line 411) are shown so that it may be realized that the present circuit communicates with other logics in the input/output scheme. The communication path to the bus is represented by I/O pin "N" line 411, which has an arrow to denote its external world interconnection. The logics shown are implemented as very large scale integrated circuitry in CMOS technology.

During clock phase 1 all circuits on the bus have the following happen. The NAND gate 402 is enabled by the clock phase 1 ($\phi$1) signal on line 401, and its output goes to a logical Low driving the gate of P type transistor 404 to a logical Low through line 413. The causes P type transistor 404 to turn on, connecting I/O pin "N" line 411 to the +3 volts supply 406 and causing the bus to go to the logical High condition of approximately +3 volts d.c. Since all interconnected units on the bus are driving a logical High at this time, the amount of current that any one P type transistor must furnish is rather small. This allows the P type transistor 404 to be made relatively small. Since the P type transistor 404 exhibits approximately three times the impedance of N transistor 408 as implemented in CMOS technology, and has to be three times as large to furnish the same amount of charging current, the present arrangement minimizes transistor sizes. In other words, the necessarily larger P type transistor 404 is chosen to drive high with a light load due to sharing. The necessary size of P type transistor 404 is determined by the capacitance of the bus, the number of additional transistors driving in unison, and the time scale in which it is desired to recover the bus to a logical high condition. If two to twenty P type transistors are interconnected on approximately one meter (39.37 inches) of bus possessing a capacitance of 2.56 picofarads per centimeter (6.6 picofarads per inch), a transistor size of 600 by 2 microns will enable the time recovery of the bus as shown in FIG 5. That is, a bus line will be driven High within eight nanoseconds. Thus, the bus is driven High during phase one in a manner which is referred to as parallel, reinforcing, combinatorial, and synergistic.

Returning to FIG. 4, during clock phase 2 each of the unit(s) which own(s) the bus will impress a signal on data out pin "N" line 411 in accordance with whether a logical "0" or "1" is to be driven. If a logical "1" is to be driven, the signal Data Out Pin "N" on line 419 will be a logical High. The signal clock phase 2 ($\phi$2) on line 403 strobes NAND gate 410 and will cause a logical Low to be output on line 415. This logical Low is inverted by inverter 412 and applied as a logical High through line 417 to the base of N type transistor 408. This causes N transistor 408, of the unit which owns this particular bus line for this bus cycle time, to drive the bus line to a logical Low signifying an active signal or a logical "1". The size of the single N type transistor required to do this for the bus of the formerly discussed characteristics is approximately 800 by 2 microns as implemented in CMOS technology. Such a transistor can individually discharge the entire 256 picofarads of bus capacitance charged to the +3 volt d.c. level to essentially 0 volt d.c. within twenty nanoseconds, as shown in FIG. 5.

Continuing in FIG. 4, if a logical "0" is to be driven the signal DATA Out Pin "N" on line 419 is at a logical Low level, the NAND gate 410 is blocked thereby, and consequently N type transistor 408 remains turned off, or non-conducting. Since P type transistor 404 has also been off since the end of clock phase 1, only the capacitance of the bus line holds the bus line high until the next phase 1. With only high input impedance receiver circuits connected to I/O pin "N" line 411 and with similar replications on other interconnected devices, an approximately 30 nanosecond hold time is easily accomplished due to the charge stored in the unavoidable capacitance of the bus. It should be noted, however, that an unused bus wil gradually drift toward the 0 volt d.c. condition which is representative of a logical "1" condition.

All interconnected unit devices, including the sending unit device(s), read, or receive, or sense, the information upon the bus line during clock phase 2 ($\phi$2) and up to 5 nanoseconds thereafter at high impedance receiver circuits connected to signal "To Input Data and Stuck Low Test" on line 409 (same as line 411). Such a specific receiver circuit is shown in FIG. 82 of the aforementioned U.S. patent application Ser. No. 356,051, the contents of which are specifically incorporated herein by reference. The actual first CMOS logical element into which the signal "To Input Data and Stuck Low Test" on line 409 is received happens to be a simple CMOS inverter logic element. In the referenced FIG. 82, there is an additional utilization of the signal on line 409 for purposes of a testing of the bus line, as is described in the referenced patent application, to be stuck low during phase I. That connection, also a "receiver", happens to be as one input of a negative OR two input, or NOR, gate. The pertinent point is that any number of high input impedance receiver logic elements, which may be gated or have their outputs latched or utilized at respective clock phase 1 or clock phase 2 times, are trivial of implementation in CMOS technology. The two-time-phased bus electrical protocol or scheme, and the driver apparatus for so implementing such protocol, are the crux of the present invention, and not any receiver apparatus, of which several satisfactory logical configurations may be readily implemented. All that should be noted is that, in accordance with the timing of the electrical protocol of the present invention shown in FIG. 5, and particularly in accordance with the timing of the discharge of the I/O Pin "N" Bus Line in the instance of transmitting a logical "1", is that a receiver, of whatsoever nature, should have adequate time to discriminate amongst two alternative states of the bus line. As shown in FIG. 5, the bus lines may be sensed during the twenty nanoseconds of clock phase 2 ($\phi$2) and even, in their essentially either +3 volt d.c. or 0 volt d.c. level, during a five nanosecond period prior to the reinstitution of clock phase 1 ($\phi$1). This time is sufficient to reliably gate a CMOS logic element.

The minor variant of the present as shown in FIG. 4b is to counteract the drift toward 0 volt d.c. mentioned in the second preceding paragraph, especially as it affects tests of the bus during manufacture. An additional transistor 414 is shown in parallel with P type transistor 404. With the shunted gate as illustrated this transistor actually represents a very high resistance pull-up. The transistor 414 is dimensionally very small, approximately 4 by 2 microns. The small current it supplies to I/O pin "N" line 411 helps maintain the bus in the +3 v.d.c. logical "0" condition, especially during non-usage as would occur during production tests. Transistor 414 is so small that it exhibits only low dissipation during a casualty short on bus I/O pin "N" line 411. The small currents supplied to I/O pin "N" line 411 by all transistors 414 as are replicated upon each interconnected device are, in aggregate, easily shunted to ground by the much larger N type transistor 408 during phase II in whatsoever bus interconnected device(s), if any, as desire to drive a logical "1". In other words, the optional pullup P type transistor 404 does not interfere with normal bus communication.

The net characteristics of the circuits of FIGS. 4a and 4b are as follows. Each utilizes a two-time-phased electrical communication protocol. Each also utilizes the unavoidable wiring capacitance of the driven bus interconnect. The numerous additive active distributed pull-up devices can be constructed in high speed VLSI circuit technologies, and thereby avoid the need for passive pull-up resistors. Bus lines so operative are capable of two point driver to receiver communication. When multiple drivers signal on a bus line the resultant signal is the logical OR of the data sent from all other drivers. Any or all bus connected driver/receivers, whether associated information transmitting or passive devices, are able to read the bus lines during clock phase 2. If multiple devices on a bus line are enabled for utilization of the same signal which all can receive in parallel, it would be considered that they were receiving a broadcast communication. Conversely, since a bus line connected device can receive a signal without either directed enablement or disruption of the process of communication, the present method supports eavesdropping by such bus line interconnected devices.

What is claimed is:
1. The method of driving a communications bus line connecting a plurality of driver/receiver elements, said communication bus line having inherent capacitance, said method comprising:
applying a first signal to said bus line during a first time interval from each and all of said driver/receiver elements in order to drive said bus line to a first voltage level representing a first logic state; and,
applying a second signal to said bus line during a second time interval from those ones of said driver/receiver elements which desire to drive said bus line to a second voltage level representing a second logic state, said second signal as applied from any one or ones of said driver/receiver elements which desire to drive said bus line to said second voltage level being sufficient to do so drive said bus line to said second voltage level;

wherein if none of those said ones of said driver/receiver elements do desire to drive said bus line to said second voltage level then said inherent capacitance of said bus line will maintain said bus line substantially at said first voltage level representing said first logical state for at least a portion of said second time interval.

2. The method of driving a communications bus line of claim 1 wherein said applying a first signal further comprises:

applying a first signal to drive said bus line to a non-zero voltage level representing a binary logical state of "0";

and wherein said applying a second signal further comprises:

applying a second signal to drive said bus line to a zero voltage level representing a binary logical state of "1", wherein all said driver/receiver elements are connected wired-OR upon and by said bus line, said wired-OR meaning that IF any one of said driver/receiver elements does desire to and does drive said bus line to said zero voltage level representing a binary logical state of "1" THEN said any one driver/receiver element which does drive said bus line to said zero voltage level will establish that the entire said busline is at said binary logical state of "1", and ONLY IF none of said driver/receiver elements does desire to or does drive said bus line to said zero voltage level THEN said inherent capacitance of said bus line will maintain said bus line substantially at said non-zero voltage level representing said binary logical state of "0" for at least said portion of said second time interval.

3. A method of communicating between a plurality of driver/receiver elements interconnected on a single signal line which signal line is part of a communication bus containing a plurality of such signal lines interconnecting a plurality of devices, which method conmprises:

first current-driving said interconnecting signal line to a non-zero voltage condition from all said interconnected driver/receiver elements during a first period of time, which first period of time is common to all said interconnected driver/receiver elements; then terminating all said first current drive from all said driver/receiver elements to said interconnecting signal line at a time ending said first period; then independently at each interconnected driver/receiver element during a second period of time immediately following said first period of time either (1) allowing the capacitance of said interconnecting signal line to maintain said signal line at substantially said non-zero voltage condition, in the case that said each interconnected driver/receiver element does not wish to transmit information OR wishes to transmit binary "0" information, or else (2) second current-driving said interconnecting signal line toward a zero voltage condition in the case that said each interconnected driver/receiver element wishes to transmit binary "1" information; while also during second period of time sensing said interconnecting signal line at all said interconnected driver/receiver elements in order that it may be recognized if said interconnecting signal line continues substantially unchanged at said non-zero voltge condition or whether said interconnecting signal line has been second current-driven toward a zero voltage condition by said second current-driving at some one(s) of said interconnected driver/receiver elements; while also during said second period of time interpreting at all said interconnected driver/receiver elements said sensing of said interconnecting signal line to continue substantially unchanged at said non-zero voltage condition to mean that said interconnecting signal line has transmitted during said second period of time a binary "0" and said sensing that said interconnecting signal line has been second current-driven toward a zero voltage condition to mean that said interconnecting signal line has transmitted during said second period of time a binary "1".

4. The communication method of claim 3 wherein further comprises: disconnecting all current drive from any and all of said interconnected driver/receiver elements to said interconnecting signal line at the end of said second period of time;

wherein said first current-driving may be subsequently reinitiated and cyclic communication transpire.

5. The communication method of claim 3 or claim 4 wherein (1) said first current-driving transpiring during said first period of time, and (2) either said allowing said capacitance of said interconnecting signal line to maintain said signal line at substantially said non-zero voltage condition or said second current-driving said interconnecting signal line toward said zero voltage condition transpiring during said second period of time, and (3) said sensing also transpiring during said second period of time, all transpire within forty nanoseconds, meaning that said first period of time plus said second period of time is less than or equal to forty nanoseconds.

6. The communication method of claim 3 wherein said interpreting step further comprises:

interpreting at all said interconnected driver/receiver elements said sensing of the continuation of said interconnection signal line substantially unchanged at said non-zero voltage condition as the transmission of a binary "0" upon said interconnecting signal line, or else said sensing of said interconnecting signal line to have been second current-driven toward a zero voltage condition as the transmission of a binary "1" upon said interconnecting signal line;

wherein since one or more of said interconnected driver/receiver elements may perform said second current-driving then said interpreting at all said interconnected driver/receiver elements will be of the transmission of a binary "0" only if no one of any said driver/receiver elements has second current-driven said interconnecting signal line toward a zero voltage condition, but will be of the transmission of a binary "1" if any one or ones of said driver/receiver elements has driven said interconnecting signal line toward a zero voltage condition;

whereby any one of said driver/receiver elements can cause the transmission of a binary "1", but all said driver/receiver elements must identically restrain from second current-driving said interconnecting signal line to cause the transmission of a binary "0", which transmission is thusly logically wired-OR between all said driver/receiver elements.

7. A digital bus line driver apparatus for receiving voltage, ground, a universal two-phase clock signal, and an individually unique binary-stated data signal, and for synchronously driving responsively to said individually unique binary-stated data signal a digital communication bus line interconnecting a plurality of like digital bus line driver apparatus, each said apparatus comprising:

bus line charging means between said voltage and said bus line for, responsively to a first phase of said universal two-phase clock signal, conductively charging from said voltage said bus line to substantially said voltage during said first phase, and for not conducting and presenting high impedance to said bus line during a second phase of said universal two-phase clock signal, in series with;

busline selective discharging means between said bus line and said ground for not conducting and presenting high impedance to said bus line during said first phase of said universal two-phase clock signal, and, for IF a first, true, binary state is resultant from the logical ANDing of said individually unique binary-stated data signal and said second phase of said universal two-phase clock signal, THEN conductively discharging said bus line substantially to ground meaning zero voltage during said second phase of said universal two-phase clock signal, ELSE IF a second, false, binary state is resultant from said logical ANDing THEN not conductively discharging said bus line substantially to ground and continuing presenting high impedance to said bus line;

wherein said conductively charging of said bus line does thusly invariably transpire jointly from all said plurality of like digital bus line driver apparatus, which apparatus are interconnected by said bus line, during said first phase of said universal two-phase clock;

wherein said conductively discharging of said bus line will transpire from only those one or ones, if any, of said plurality of like digital bus line driver apparatus wherein said first, true, binary state is resultant from said logical ANDing of said individually unique binary-stated data signal and said second phase of said universal two-phase clock signal.

8. The digital bus line driver apparatus of claim 7 which further comprises:

pull-up means of high resistance between said voltage and said bus line for always providing small current from said voltage for charging said bus line from said voltage to a non-zero voltage;

wherein only said small current will be provided from said voltage to said bus line when and if said bus line is conductively discharged to ground by one or ones of said bus line selective discharging means which are within each of said plurality of digital bus line driver apparatus which are interconnected by said digital communication bus line.

9. A line driver apparatus for receiving a first time phasesignal, a second time phase signal, a data signal, and a source of voltage and ground and for driving a communication line in response thereto, which apparatus comprises:

gating means for logically ANDing said second time phase signal and said data signal into a second time phase gated-data signal;

a first field effect transistor means for invariably current driving only during a first time phase signal a communication line means toward the voltage of said source of voltage, the source terminal thereof said first field effect transistor means connected to said source of voltage, with the base terminal thereof connected to said first time phase signal, and with the drain terminal thereof series connected to a second field effect transistor means for current sinking during said second time phase gated data signal a charged output communication line means towards said ground, the source terminal thereof said second field effect transistor means connected to said drain terminal of said first field effect transistor means, with the base treminal thereof connected to said second time phase gated-data signal developed by said gating means, and with the drain terminal connected to ground;

output communication line means connected to said first field effect transistor means and said second field effect transistor means at their series interconnect point for transmitting current driven toward said source of voltage by said first field effect transistor means during said first time phase signal, and for transmitting current sinked toward said ground by said second field transistor means during said second time phase gated signal, to current receiver means; and current receiver means for receiving current transmitted by said output communication line means.

10. The apparatus according to claim 9 which further comprises:

resistor means between said source of voltage and said output communication line means.

11. A line driver apparatus for always driving a signal line to a non-zero voltage during a first period, and for dependently upon the alternative states of a binary data signal, either presenting high impedance to said signal line or else driving said signal line to a zero voltage during a second period; said apparatus comprising:

timing means for supplying a first period signal followed by a second period signal;

a non-zero voltage source means for supplying non-zero voltage;

a zero voltage ground source means for supplying zero voltage ground;

a first field effect transistor means between said non-zero voltage source means and said signal line with the gate thereof said first field effect transistor means connected to said timing means for, responsively to said first period signal followed by said second period signal driving said signal line from said non-zero voltage source during said first period while presenting a high impedance between said signal line and said voltage source elsetimes;

logical AND gate means for logically ANDing said second period signal AND said data signal; and a second field effect transistor means between said zero voltage ground source means and said signal line with the gate thereof said second field effect transistor means connected to said logical AND gate means for, responsively to the logical ANDing of both said second period signal and said data signal within said logical AND gate means, IF both said second period signal and said binary data signal are of the logically true, or "1", binary state THEN driving said signal line toward said zero voltage ground ELSE IF either said second period signal or said binary data signal is of the logically false, or "0", binary state THEN presenting a high impedance between said signal line and said zero voltage ground source means.

12. A wired-OR bus interconnection system comprising:
   a data bus line;
   a plurality of driver/receiver elements connected to said data bus line;
   means producing sequences of first and second clock signals,
   each said driver/receiver element including first means responsive to said first clock signals to drive said data bus line to a first voltage level representing a first logic state, each of said driver/receiver elements being simultaneously responsive to each of said first clock signals, and,
   each said driver/receiver element including a second means responsive to said second clock signals for driving said data bus line to a second voltage level representing a second logic state if said driver/receiver element receives a data signal during the presence of said second clock signals and
   means for selectively applying data signals to said second means in each of said driver/receiver elements.

13. A bus line driver apparatus which is replicated at the situs of each of a plurality of devices, said replicated bus line driver apparatus being interconnected by a bus line, each said replicated bus line driver apparatus implemented in Complementary Metal oxide Semiconductor (CMOS) technology, each said replicated bus line driver apparatus comprising:
   first transistor means implemented in CMOS technology for charging said bus line to a non-zero voltage; series connected with
   second transistor means implemented in CMOS technology for discharging said busline to a zero voltage;
   wherein a first said first transistor means part of a first said bus line driver apparatus is jointly operative with a second said first transistor means part of a second said bus line driver apparatus to jointly charge said bus line to a non-zero voltage of magnitude of 3 volts d.c. within eight nanoseconds if and when said bus line is possessed of no more than 256 picofarads of capacitance essentially physically uniformly distributed along a voltage propagation path of length up to one meter;
   wherein said first transistor means within each and every said replicated bus line driver apparatus are always simultaneously jointly and collectively operative during a first time period longer than said eight nanoseconds for collectively charging said bus line to a non-zero voltage.

14. The bus line driver apparatus according to claim 13 wherein each said individual one of said second field effect transistor means within each individual one said replicated bus line driver apparatus is individually capable of discharging up to 256 picofarads of capacitance essentially physically uniformly distributed along a voltage propagation path of length up to one meter charged to a magnitude of three volts d.c. to said zero voltage ground level of within 20 nanoseconds; and
   wherein two or more of said second transistor means each within a said replicated bus line driver apparatus MAY SOMETIMES by being simultaneously jointly and collectively operative during second time periods greater than said twenty nanoseconds, separate from said first time periods, discharge said bus line to said zero voltage ground level BUT UPON AT LEAST ONE of said second time periods a single individual one of said second transistor means within a single individual one said replicated bus line driver apparatus will individually discharge said bus line to said zero voltage level.

15. The bus line driver apparatus of claim 13 wherein said up to 256 picofarads of capacitance encompasses individual capacitances additive from any or all of the following sources
   up to one meter of standard unshielded printed circuit land upon a dielectric substrate; and
   up to eighteen further replications, beyond said first and said second bus driver apparatus, of said bus driver apparatus, which may be powered or not in any combination, essentially physically uniformly distributed along said bus line; and
   up to two receiver logic elements, said logic elements being of the typical capacitance of an inverter or an OR gate implemented in CMOS technology associated with each of said first and said second and said up to eighteen replications of said bus driver apparatus as are essentially evenly physically uniformly distributed along said bus line; and
   parasitic capacitances associated with the normal interconnections made between each of the priorly listed sources;
   wherein an actually physically realizable useful structure of up to twenty bus-line-interconnected devices is encompassable within 256 picofarads of capacitance which capacitance is chargeable to said non-zero voltage by two of said first field effect transistor means jointly operative to do so.

* * * *

UNITED STATES PATENT AND TRADEMARK OFFICE
CERTIFICATE OF CORRECTION

PATENT NO. : 4,500,988
DATED : February 19, 1985
INVENTOR(S) : Donald B. Bennett, Lee T. Thorsrud, Thomas W. Petschauer It is certified that error appears in the above-identified patent and that said Letters Patent is hereby corrected as shown below:

Column 11, Line 46, "conm-" should be -- com- -- .

Column 12, Line 24, "wherein" should be -- which -- .

Column 12, Line 48, "interconnection" should be -- interconnecting -- .

Column 13, Line 67, "phasesignal," should be -- phase signal, -- .

Column 14, Line 21, "treminal" should be -- terminal -- .

Column 15, Line 37, "oxide" should be -- Oxide -- .

Signed and Sealed this

Sixteenth Day of July 1985

[SEAL]

Attest:

DONALD J. QUIGG

*Attesting Officer*    *Acting Commissioner of Patents and Trademarks*